United States Patent [19]

Byer et al.

[11] 4,060,729

[45] Nov. 29, 1977

[54] PYROELECTRIC DETECTOR WITH DECREASED SUSCEPTIBILITY TO VIBRATIONAL NOISE

[75] Inventors: Norman E. Byer, Columbia; Stanley E. Stokowski, Ellicott City; John D. Venables, Baltimore, all of Md.

[73] Assignee: Martin Marietta Corporation, Bethesda, Md.

[21] Appl. No.: 749,256

[22] Filed: Dec. 10, 1976

[51] Int. Cl.² .............................................. G01T 1/16
[52] U.S. Cl. ................................................... 250/338
[58] Field of Search ........................ 250/338, 340, 349

[56] References Cited

U.S. PATENT DOCUMENTS 3,985,685  10/1976  Houlton et al. ................. 250/338 X Primary Examiner—Davis L. Willis
Attorney, Agent, or Firm—Gay Chin; James B. Eisel

[57] ABSTRACT

Pyroelectric thermal detector with decreased susceptibility to vibrational noise is formed of a wafer of pyroelectric material having a thin central region supported and surrounded by a thicker rim. On the central region deposited electrodes define active detecting regions that are mirror images of each other across a line separating them. The active regions may be oppositely polarized domains electrically connected in parallel, or a continuous domain with the active regions electrically connected in series opposition. The deposited electrodes are brought out to the rim for external connection. The rim is everywhere spaced at least one thermal diffusion length from either active region. Mechanical support for the wafer is connected to the rim, is symmetrically disposed with respect to the line separating the active detecting regions, and is in contact with the rim over at least 75 percent of its linear extent.

18 Claims, 4 Drawing Figures

PYROELECTRIC DETECTOR WITH DECREASED SUSCEPTIBILITY TO VIBRATIONAL NOISE

BACKGROUND OF THE INVENTION

1. Field of the Invention

The invention is a pyroelectric thermal detector.

Radiation detectors fall into two broad categories, based on the nature of the energy detected. Quantum, or photon, detectors respond to the effects of discrete electronic excitations within the detector material caused by the action of the individual photons that form the beam of radiation. Thermal detectors, on the other hand, respond to changes in the temperature of the detector material caused by absorption of energy from the incident beam. This absorption of the radiant energy may be accomplished either directly by adsorption within the detector material itself, or indirectly by absorption in a suitable auxiliary structure that conducts the heat to the detector material.

The different types of thermal detectors are characterized by the particular thermally varied characteristic of the detecting material that is monitored in each case. There are thermal detectors that depend on the thermal expansion of solids, liquids or gases; on variations in electrical resistance (bolometers); in thermoelectric power (thermocouples); in dielectric permittivity (dielectric bolometers); in the resonant frequency of piezoelectric crystal resonators; in the spontaneous magnetization of ferromagnetic materials (pyromagnetic detectors); and in the spontaneous electrical polarization of pyroelectric materials (pyroelectric detectors).

2. Prior Art

Pyroelectric thermal detectors operate at normal ambient temperatures and this makes them desirable for use as infra red (IR) detectors in comparison with detectors that require cooling. In a typical pyroelectric detector, incident radiant heat flux is absorbed by the pyroelectric crystal and is converted into heat. The change in crystal temperature resulting from the heat absorption alters the lattice spaces within the crystal and produces a change in spontaneous electric polarization. Electrodes are placed on the crystal surfaces that are normal to the crystal polarization axis. When the electrodes are connected to an external circuit, a current proportional to the rate of change of temperature is generated that will, for instance, produce a voltage change across a load resistor.

The sensitivity of a detector is commonly expressed in terms of the noise equivalent power (NEP) which is defined as the incident signal power, normalized to unit frequency bandwidth at a given operating frequency and radiation wavelength, for which the signal-to-noise ratio is unity. Another common measure of detector sensitivity is the detectivity ($D^*$) given by $$D^* = \frac{(A)^{\frac{1}{2}}}{NEP} = \frac{R_v(A)^{\frac{1}{2}}}{V_N},$$

where $R_v$ = voltage responsivity (in Volts/Watt),
$A$ = area of the detector element (in cm$^2$), and
$V_N$ = voltage noise of the detector-preamp combination referred to the preamp output [in Volts/Hz$^{\frac{1}{2}}$].

An increase in $D^*$ can be obtained by maximizing the responsivity $R_v$ and/or minimizing the noise voltage $V_N$.

Noise voltage $V_N$ is produced by both intrinsic noise sources, located within the detector or its preamplifier, and ambient noise sources. Noise voltages due to ambient noise sources may be reduced either directly, by attenuation of the source, or indirectly, by circuitry designed to minimize the voltage generated in the detector. One type of such circuitry cancels noise voltage while retaining the signal voltage. Two complementary detecting elements are used, only one of which is exposed to the signal source at any time, but both of which produce identical noise voltages generated by ambient noise sources. The two detecting elements are connected in opposition so that the noise voltages cancel, while the signal voltage, appearing on only one element at any given time, is not cancelled. Such circuitry is shown in U.S. Pat. No. 3,453,432 to McHenry and in U.S. Pat. No. 3,842,276 to Southgate. Prior art devices or systems for reduction of ambient noise in pyroelectric detectors have focused on noise generated by ambient temperature variations. Ambient noise in pyroelectric detectors, however, is generated not only by temperature variations, but also by ambient vibrations, since the piezoelectric properties of pyroelectric materials cause mechanical vibrations to be translated into voltages. Vibration induced noise can be significant in a detector to be used, for instance, in an aircraft or missile. Cancellation circuitry ambient noise reduction techniques require as nearly identical noise voltages as possible on each complementary detecting element, and the prior art has not, to our knowledge, addressed the problem with regard to vibration noise.

Further, our detector is to have a high $D^*$ and be suitable for operation at low modulation frequencies, at or below about 1000 Hz, both requirements posing additional difficulties in designing a detector with low susceptibility to vibration. Since most intrinsic noise sources are inverse functions of the thickness of the pyroelectric detecting wafer, and since a high $D^*$ requires low noise, both intrinsic and ambient, then elements are necessary. The design of detectors for operation at modulation frequencies of 1000 Hz or below imposes special problems, since to achieve maximum $D^*$ the active detecting region, that is, the portion of the pyroelectric wafer located between the electrodes, must be thermally isolated. This requirement precludes the conventional construction technique of mounting the detecting wafer flat on a substrate, which would minimize the effects of ambient vibration on the detecting wafer. A low frequency detector having a high $D^*$, therefore, means a thin wafer with a thermally isolated detecting element, a difficult device in which to reduce noise voltage due to ambient vibration.

SUMMARY OF THE INVENTION

The detector includes an integral wafer of pyroelectric material having a very thin central region surrounded by a rim many times thicker. On the central region, electrodes deposited on both surfaces define complementary active detecting regions that are mirror images about the line between them. The two active detecting regions are electrically connected so that ambient noise voltages cancel; they are either identically polarized and connected in series opposition, or oppositely polarized and connected in parallel. Extensions of the electrodes lead to the rim, where all external electrical connections are made. Wafer supporting structure makes contact with the wafer only on the rim and is symmetrically disposed about the line between the active detecting regions. Preferably the supporting structure is in continuous contact with the rim over at least 75 percent of its linear extent.

DETAILED DESCRIPTION OF THE INVENTION

Figure 1:
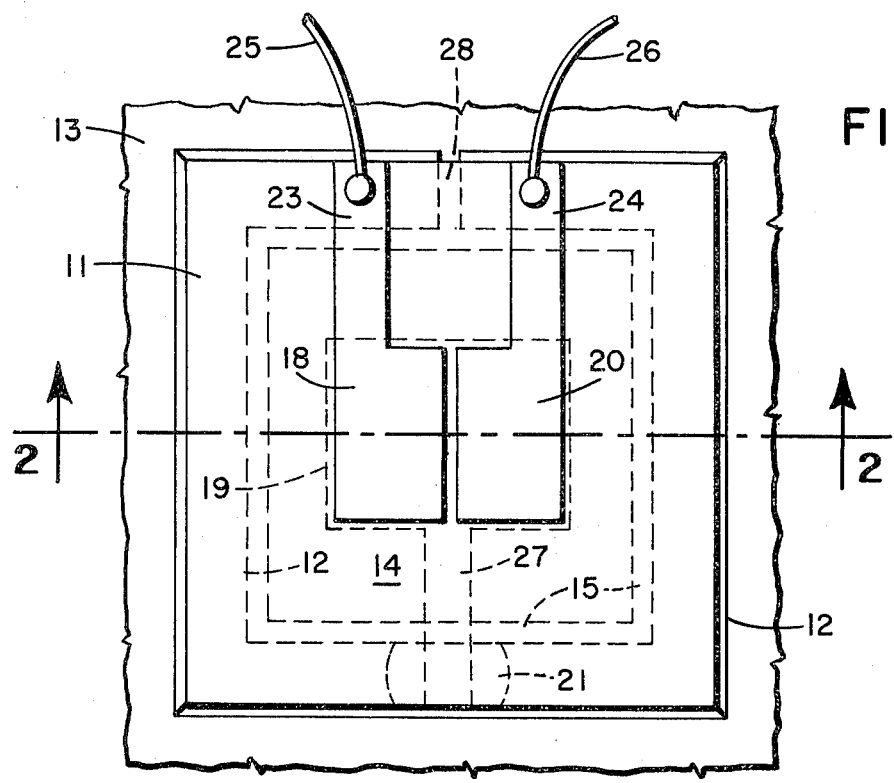
FIG. 1 is a plan view diagram of a detector element constructed in accordance with this invention.
Figure 2:
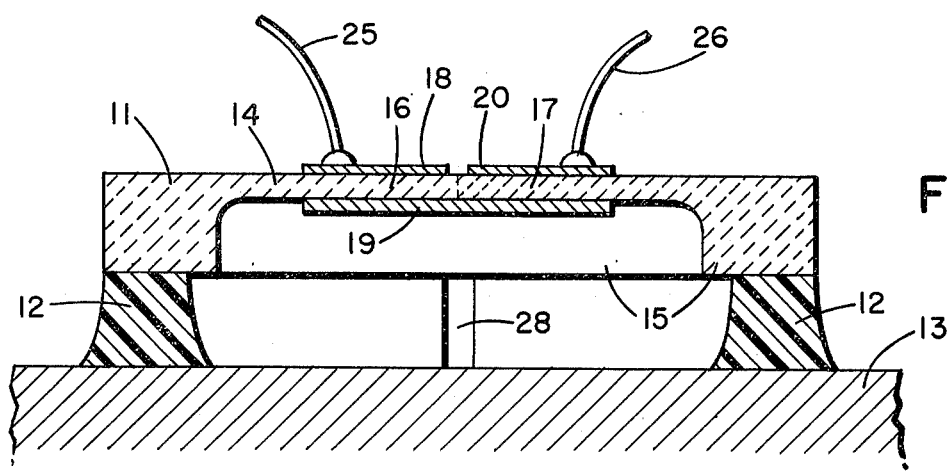
FIG. 2 is a section taken along the line 2—2 of FIG. 1.

FIGS. 1 and 2 show a detector element comprising a monolithic or integral wafer 11 of pyroelectric material mounted by a bead or ring of epoxy material 12 upon a base 13 that typically comprises a TO-5 header. Wafer 11 comprises a central region 14 of substantially uniform thickness surrounded by a rim 15 that is many times as thick as the central region.

Two active detecting regions 16 and 17 are defined by electrodes deposited on both faces of central region 14. The overlapping or opposing portions of electrodes 18 and 19 define detecting region 16 and the opposing portions of electrodes 20 and 19 define detecting region 17. Extensions 23 and 24 of electrodes 18 and 19 respectively extend those electrodes out to rim 15, where they are connected to wires 25 and 26, respectively. Extension 27 of electrode 19 is brought out to the rim on the other side of wafer 11. Mounting ring 12 comprises a nonconducting epoxy except for one small segment 21 which is of conducting epoxy and in which extension 27 of electrode 19 is embedded. This grounds electrode 19 by connecting it electrically to conducting base 13.

Figure 3:
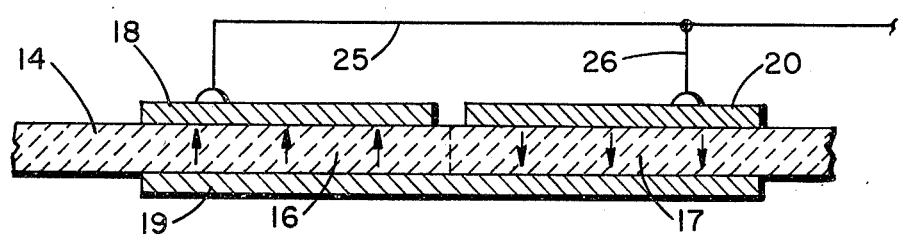
FIG. 3 is an enlarged diagram of the detecting elements of the embodiment shown in FIGS. 1 and 2, shown electrically connected in parallel.

The two active detecting regions 16 and 17 defined by the opposed electrodes serve as complementary detecting elements for noise cancellation. The ambient noise voltages generated in the two elements must be as nearly identical as possible, and the elements must be electrically connected so that these noise voltages are opposed and therefore cancel. As shown in more detail in FIG. 3, detecting regions 16 and 17 are oppositely polarized. Polarization of the pyroelectric material is accomplished by impressing an appropriate D.C. voltage across the wafer in accordance with well-known techniques. Region 16 is polarized in the opposite direction to region 17, that is, the areas of the wafer on either side of the imaginary line separating regions 16 and 17, shown dashed in FIG. 3, are oppositely polarized. The arrows in FIG. 3 indicate the opposite directions of wafer polarization. This results, of course, in the electrical signals generated in the two regions being of opposite polarity. The complementary detecting regions are connected in parallel, as shown in FIG. 3, by joining wires 25 and 26, thus connecting electrodes 18 and 20, and by grounding electrode 19 to base 13 through its extension 27 and the conducting segment of epoxy 21, as previously described.

Since the electrical signals generated in the two detecting regions are of opposite polarity, and the regions are electrically connected in parallel, then identical noise signals appearing on both detecting regions will cancel. Signals appearing on only one detecting region and not the other will, of course, not be cancelled, and the operation of such complementary detecting elements requires the impingement of the radiation to be detected on only one of the two regions at any one time. The means for accomplishing this are not part of this invention; the radiation may be simply blocked from one or the other detecting region as in the Southgate or McHenry patents referred to previously, or more sophisticated optical techniques well known in the art, such as deflecting the incoming radiation back and forth between the regions, may be employed, as connected on below in connection with modulation.

Figure 4:
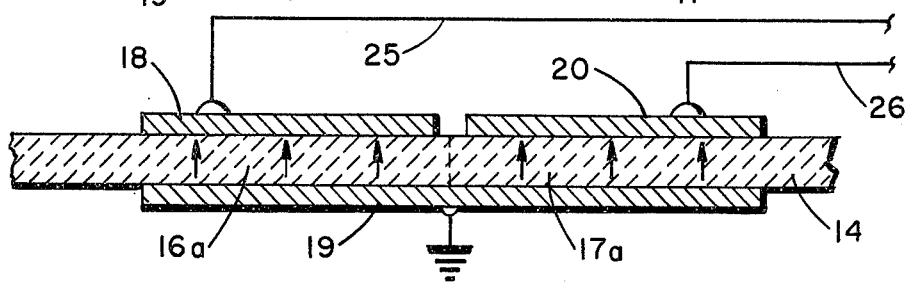
FIG. 4 is an enlarged diagram of the detecting elements of another embodiment of the detector, shown electrically connected in series opposition.

The embodiment shown in FIG. 4 shows another way of arranging the complementary detecting regions. This embodiment is identical to that described and shown in FIGS. 1 to 3 except that the detecting regions are both polarized in the same direction and are connected electrically in series opposition to effect cancellation of the noise signals. The arrows on either side of the dashed line indicating the imaginary line dividing regions 16a and 17a, as they are designated in this embodiment, indicate the same polarization direction. Wires 25 and 26 are not connected, but constitute the two leads to the device. In this configuration, electrode 19 would not be connected to ground, so extension 27 would not be needed, or if it existed would not be electrically connected to base 13. The series electrical path in the FIG. 4 embodiment can be seen to run, starting with wire 25, through electrode 18 and region 16a in one direction, then through electrode 19, region 17a in the opposite direction and through electrode 20 and out through wire 26. The two regions are thus connected so that noise signals common to both regions would be in electrical opposition and would cancel.

In order for the complementary electrode device to be effective, the ambient noise voltage on each detecting region must be as nearly identical as possible. The use of a monolithic or integral wafer for both complementary detecting regions removes the possibility that wafer structural differences, such as might occur if two discrete detector wafers were used, might convert common vibrational stresses into different noise voltages, which would not cancel. All structural supports for wafer 11, as well as all external electrical connections, must contact rim 15 only, and must be disposed symmetrically about the line between regions 16 and 17 so that all mechanical stresses transmitted to those regions from ambient vibration will be identical, and will therefore result in identical noise signals.

In the embodiments of the invention shown, supporting ring 12 is continuous except for a small opening 28 to prevent sealing the volume under the wafer, which would permit atmospheric changes to distort the wafer. Opening 28 is located on the line between regions 16 and 17 to preserve symmetry about that line. As long as the supporting ring contacts the rim over at least 75 percent of the linear extent of the rim, the opening 28 may be larger than shown. In fact, if supporting ring 12 is all conducting epoxy, instead of nonconducting, the opening should be large enough so that no conducting epoxy contacts rim 15 opposite electrode extensions 23 and 24, to avoid undesired capacitive effects. The mounting for wafer 11 need not be an epoxy ring as shown, but whatever mounting is employed, it must take continuous contact with the rim over at least 75 percent of the linear extent of the rim, and must be disposed symmetrically about the line between the detecting regions.

Most intrinsic noise sources are inverse functions of the thickness of the detecting wafer, so it is desirable to make the wafer as thin as possible. The thickness of central region 14 of the detector of this invention should be less than 30 micrometers ($\mu$m), and preferably from 2-5 $\mu$m, which latter range is achievable by means of ion beam milling. Rim 15 should be at least several times the thickness of central region 14, and is preferably about 25 to 30 $\mu$m.

The detector of this invention is designed for use with radiation modulation frequencies of less than 1000 Hz. The modulation may be either the modulation of the radiation source or modulation generated by the system optics. The optical system is not part of this invention, and some known systems that would be suitable for use with the detector of this invention are described in U.S. Pat. No. 3,727,057 to Higby et al. With such low frequencies, it is essential that the detecting regions be thermally insulated. The thick rim 15 effectively acts as a heat sink for the thin wafer material of central region 14. To provide the necessary thermal isolation of detecting regions 16 and 17 from rim 15, the detecting regions are separated from rim 15 a distance of at least one thermal diffusion length at the lowest modulation frequency for which the detector is to be used. That is, one thermal diffusion length is the minimum distance between any part of either detecting region 16 or 17 and any point on rim 15. Thermal diffusion length, in heat transfer theory, is the length characteristic of the attenuation of the temperature wave. It is expressed mathematically as:

$$l = \sqrt{\frac{k}{2\pi f}}$$

where:
$l$ = thermal diffusion length
$k$ = thermal diffusivity of the material
$f$ = modulation frequency of the incident radiation While we have used LiTaO$_3$ as the wafer material in constructing detectors in accordance with this invention, the invention is not limited to it, and any suitable pyroelectric material may be used. It may be desirable to coat the detecting region or regions with an absorbent black coating. Such a coating forms no part of this invention and it has been omitted from the drawings and descriptions for simplicity.

Active detecting regions 16 and 17 need not have the shapes shown. In order that the noise voltages generated in them be identical, their configuration need not be rectangular or square, but must be such that they form mirror images across the line between them.

We claim:
1. A radiation detector comprising:
an integral wafer of pyroelectric material, said wafer comprising a relatively thin central region of substantially uniform thickness surrounded by a supporting rim having a thickness many times greater than said central region;
electrodes deposited on both surfaces of said central region defining between them at least one active detecting region;
external electrical connections to said electrodes being located on said rim on extensions of said electrodes beyond said active detecting region or regions; and
supporting means for said wafer attached only to said rim.

2. A radiation detector in accordance with claim 1 wherein said central region has a thickness of less than 30 micrometers.

3. A radiation detector in accordance with claim 1 wherein all portions of said active detecting region or regions are spaced from the nearest point of said rim at least one thermal diffusion length at the lowest modulation frequency at which the detector is to be used.

4. A radiation detector in accordance with claim 3 wherein said central region has a thickness of less than 30 micrometers.

5. A radiation detector in accordance with claim 1 wherein said wafer supporting means makes continuous contact with said rim over more than 75 percent of its linear extent.

6. A radiation detector in accordance with claim 5 wherein said central region has a thickness of less than 30 micrometers.

7. A radiation detector in accordance with claim 6 wherein all portions of said active detecting region or regions are spaced from the nearest point of said rim at least one thermal diffusion length at the lowest modulation frequency at which the detector is to be used.

8. A radiation detector comprising:
a wafer of pyroelectric material;
electrodes deposited on both surfaces of said wafer defining between then two detecting regions that form mirror images on opposite sides of a line between them;
supporting means for said wafer located on portions of said wafer other than said active detecting regions and being disposed symmetrically about said line between said active detecting regions.

9. A radiation detector comprising:
an integral wafer of pyroelectric material, said wafer comprising a relatively thin central region of substantially uniform thickness surrounded by a supporting rim having a thickness many times greater than said central region;
electrodes deposited on both surfaces of said central region and defining between them two active detecting regions that form mirror images on opposite sides of a line between them;
external electrical connections to said electrodes being located on said rim on extensions of said electrodes beyond said active detecting regions; and
supporting means for said wafer attached only to said rim and symmetrically disposed about said line between said active detecting regions.

10. A radiation detector in accordance with claim 9 wherein said central region has a thickness of less than 30 micrometers.

11. A radiation detector in accordance with claim 9 wherein said wafer supporting means makes continuous contact with said rim over more than 75 percent of its linear extent.

12. A radiation detector in accordance with claim 9 wherein said central region has a thickness of less than 30 micrometers and wherein said wafer supporting means makes continuous contact with said rim over more than 75 percent of its linear extent.

13. A radiation detector in accordance with claim 9 wherein all portions of said active detecting regions are spaced from the nearest point of said rim at least one thermal diffusion length at the lowest modulation frequency at which the detector is to be used.

14. A radiation detector in accordance with claim 13 wherein said central region has a thickness of less than 30 micrometers and wherein said wafer supporting means makes continuous contact with said rim over more than 75 percent of its linear extent.

15. A radiation detector in accordance with claim 13 wherein said two active detecting regions are polarized in the same direction and are electrically connected in series opposition.

16. A radiation detector in accordance with claim 13 wherein said two active detecting regions are polarized in opposite directions and are electrically connected in parallel.

17. A radiation detector in accordance with claim 9 wherein said two active detecting regions are polarized in the same direction and are electrically connected in series opposition.

18. A radiation detector in accordance with claim 9 wherein said two active detecting regions are polarized in opposite directions and are electrically connected in parallel.

* * * * *